(12) United States Patent
Shin et al.

(10) Patent No.: US 11,711,054 B2
(45) Date of Patent: Jul. 25, 2023

(54) FAULT DETECTION SYSTEM AND METHOD OF PHOTOVOLTAIC MODULE AND STRING

(71) Applicant: KOREA INSTITUTE OF ENERGY RESEARCH, Daejeon (KR)

(72) Inventors: Woo Gyun Shin, Sejong (KR); Suk-whan Ko, Sejong (KR); Gi-hwan Kang, Sejong (KR); Young-chul Ju, Daejeon (KR); Hye-mi Hwang, Daejeon (KR); Jong Rok Lim, Uijeongbu-si (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 0 days.

(21) Appl. No.: 17/591,314

(22) Filed: Feb. 2, 2022

(65) Prior Publication Data
US 2022/0345084 A1    Oct. 27, 2022

(30) Foreign Application Priority Data
Apr. 23, 2021    (KR) .................... 10-2021-0052747

(51) Int. Cl.
*G01R 21/06*  (2006.01)
*H02S 50/10*  (2014.01)

(52) U.S. Cl.
CPC .............. *H02S 50/10* (2014.12); *G01R 21/06* (2013.01)

(58) Field of Classification Search
CPC ......... H02S 50/10; H02S 50/00; G01R 21/06; Y02E 10/50; G06N 3/08

USPC ...................................................... 324/761.01
See application file for complete search history.

(56) References Cited

U.S. PATENT DOCUMENTS

| 2011/0184583 | A1* | 7/2011 | El-Barbari ............. H02S 50/10 700/297 |
| 2018/0375471 | A1* | 12/2018 | Yang ....................... H02S 50/10 |
| 2019/0123683 | A1* | 4/2019 | Al Shakarchi .......... H02S 40/32 |
| 2019/0204405 | A1 | 7/2019 | Arliaud et al. |

(Continued)

FOREIGN PATENT DOCUMENTS

| JP | 2020-25452 A | 2/2020 |
| KR | 10-1297078 B1 | 8/2013 |
| KR | 10-2018-0121754 A | 11/2018 |

*Primary Examiner* — Jermele M Hollington
*Assistant Examiner* — Robert P Alejnikov, Jr.
(74) *Attorney, Agent, or Firm* — Birch, Stewart, Kolasch & Birch, LLP

(57) ABSTRACT

The present invention relates to a fault detection system and method of a photovoltaic module and string. The fault detection system of a photovoltaic module and string includes a measurement input unit receiving a current power generation performance measurement value of the photovoltaic module and string from the outside, an estimation calculating unit calculating a power generation performance estimation value of the photovoltaic module and string based on input current environmental conditions, and a fault determining unit determining whether the photovoltaic module and string have a fault by comparing and analyzing the power generation performance measurement value from the measurement input unit and the power generation performance estimation value from the estimation calculating unit, wherein the photovoltaic module is configured as a double-sided or single-sided photovoltaic module.

11 Claims, 5 Drawing Sheets

(56) References Cited

U.S. PATENT DOCUMENTS

2020/0204111 A1\* 6/2020 Zhao ................. H02S 50/00
2020/0403406 A1\* 12/2020 Shafiullah ............ G06N 3/04

\* cited by examiner

A) PID PHENOMENON
B) PARTIAL SHADING OR SHADING
C) BYPASS DIODE FAULT
D) DIFFERENCE IN INSTALLATION ANGLE BETWEEN MODULES
E) CONTAMINATION AT BOTTOM OF MODULE

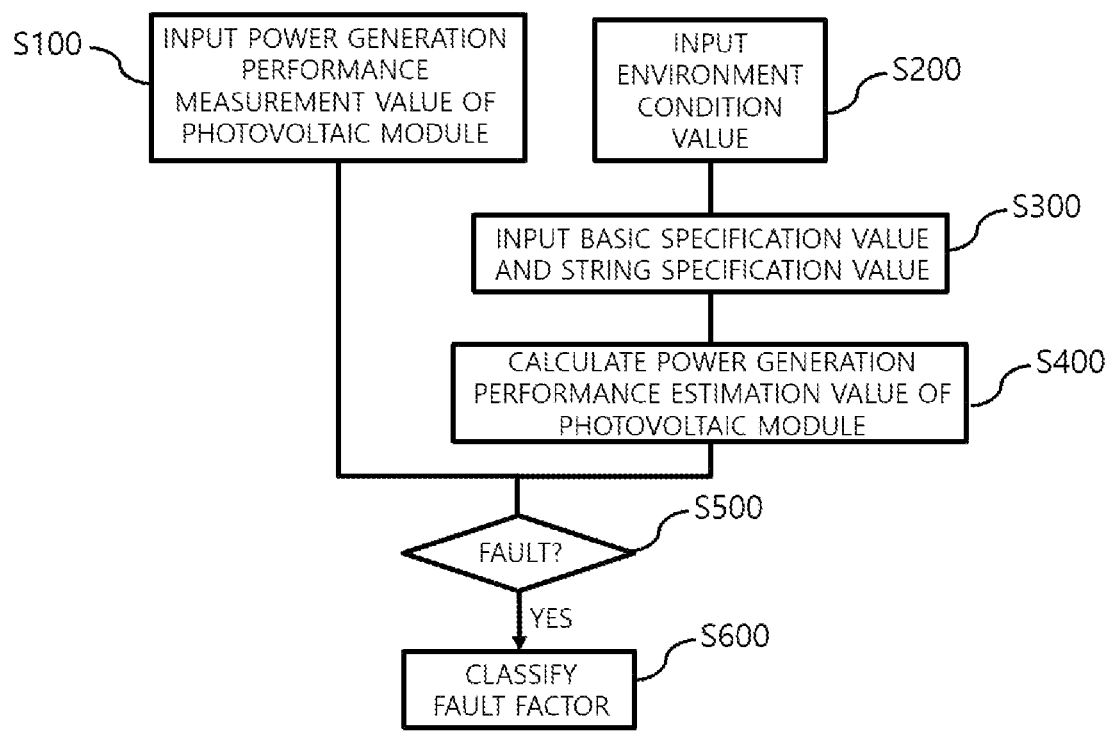

FAULT DETECTION SYSTEM AND METHOD OF PHOTOVOLTAIC MODULE AND STRING

CROSS REFERENCE TO RELATED APPLICATIONS

This non-provisional application claims the benefit under 35 U.S.C. § 119(a) to Patent Application No. 10-2021-0052747, filed in the Republic of Korea on Apr. 23, 2021, which is hereby expressly incorporated by reference into the present application.

TECHNICAL FIELD

The following discourse relates to a fault detection system and method of a photovoltaic module and string, and more particularly, to a fault detection system and method of a photovoltaic module and string to detect a fault of a photovoltaic module by comparing a power generation performance estimation value of the photovoltaic module including one side or both sides with an electrical output value (power generation performance measurement value).

Further, the present invention relates to a fault detection system and method capable of analyzing a detected fault factor of a photovoltaic module and string by applying an artificial intelligence algorithm.

BACKGROUND ART

In the case of large-scale photovoltaic power generation, a desired voltage and current are obtained by connecting photovoltaic modules in series and parallel. Here, photovoltaic modules connected in series are referred to as a photovoltaic string, and photovoltaic modules connected in parallel are referred to as a photovoltaic array.

Power generated from the photovoltaic module is DC power, and the DC power is converted into AC for transmission, and a component connected to a solar inverter for conversion is provided. Here, when voltages of a plurality of solar cell arrays are different, a loss due to mismatching occurs in the inverter.

That is, since many photovoltaic modules are interconnected, if some modules are contaminated or their characteristics are deteriorated, an output that may be obtained from the entire photovoltaic array, as well as from the photovoltaic string, is lowered, so modules with lowered performance may be repaired or replaced for maintenance.

Also, recently, as shown in FIG. 1, a double-sided photovoltaic module that may obtain additional power generation gains using reflected light from the rear, as well as the front solar power generation has been installed.

In the case of the double-sided photovoltaic module, voltage characteristics through a rear gain are similar to that of a single-sided photovoltaic module, but current characteristics appear to be different depending on an albedo value of the rear. Here, the albedo value refers to a ratio of a front insolation (or power generation) to a rear insolation (or power generation) through a pyranometer measurement value.

In general, in the case of double-sided photovoltaic modules, manufacturers of solar cell modules propose different power generation gains according to the rear albedo value, but the amount of power generation gain may be estimated using an average rear albedo characteristic value.

Various methods for detecting a fault of photovoltaic modules have been studied, but research on a double-sided photovoltaic module with a clear difference from a single-sided photovoltaic module is insufficient and a fault detection system and method of a photovoltaic module and string disclose a technique of detecting a fault of a double-sided photovoltaic module, as well as a single-sided photovoltaic module.

In this regard, Korean Patent Registration No. 10-1297078 ("Photovoltaic power generation monitoring device capable of detecting fault for each photovoltaic cell module and a fault detection method for a photovoltaic power generation system using the same") discloses a device for easily recognizing a fault that occurs in any one of a plurality of photovoltaic cell modules.

RELATED ART DOCUMENT

Patent Document

Korean Patent Registration No. 10-1297078 (Registration date: 2013 Aug. 9)

DISCLOSURE

Technical Problem

Accordingly, an embodiment of the present invention is directed to providing a fault detection system and method of a photovoltaic module and string capable of detecting normalcy/fault of a photovoltaic module and string by analyzing a difference in electrical parameter between an estimated voltage-current characteristic curve of the photovoltaic module and string and a measured voltage-current characteristic curve and classifying a kind (fault factor) of an occurring fault by analyzing a pattern of the voltage-current characteristic curve.

Technical Solution

In one general aspect, a fault detection system of a photovoltaic module and string includes: a measurement input unit 100 receiving a current power generation performance measurement value of the photovoltaic module and string from the outside; an estimation calculating unit 200 calculating a power generation performance estimation value of the photovoltaic module and string based on input current environmental conditions; and a fault determining unit 300 determining whether the photovoltaic module and string have a fault by comparing and analyzing the power generation performance measurement value from the measurement input unit 100 and the power generation performance estimation value from the estimation calculating unit 200, wherein the photovoltaic module is configured as a double-sided or single-sided photovoltaic module.

Furthermore, the measurement input unit 100 may receive current-voltage characteristic curves as the power generation performance measurement values and analyze the received current-voltage characteristic curves to extract preset electrical parameters.

Furthermore, the estimation calculating unit 200 may include: a first input unit 210 receiving environmental condition values for a current position in which the photovoltaic module and string are installed; a second input unit 220 receiving preset basic specification values of the photovoltaic module; a third input unit 230 receiving serial/parallel configuration value of the photovoltaic string; a calculating unit 240 calculating voltage and current values of the photovoltaic module by reflecting values received by the first input unit 210, the second input unit 220, and the third input unit 230 using a previously stored estimation algorithm; and an analysis unit 250 generating a current-voltage characteristic curve with the power generation performance estimation value using the voltage and current values calculated by the calculating unit 240 and analyzing the generated current-voltage characteristic curve to extract preset electrical parameters.

Furthermore, the calculating unit 200 may use different estimation algorithms according to whether the photovoltaic module is configured as a double-sided photovoltaic module or a single-sided photovoltaic.

Furthermore, the fault determining unit 300 may determine whether the photovoltaic module and string have a fault by evaluating loss amounts by comparing an electrical parameter of the power generation performance measurement value from the measurement input unit 100 and an electrical parameter of the power generation performance estimation value from the estimation calculating unit 200.

Furthermore, the fault determining unit 300 may determine that the photovoltaic module and string are normal when respective analyzed loss amounts satisfy all of reference ranges for preset electrical parameters, and may determine that the photovoltaic module and string have a fault when the respective analyzed loss amounts do not satisfy any one of the reference ranges.

Furthermore, the fault detection system may further include: a fault classifying unit 400 classifying and analyzing a fault factor of the photovoltaic module and string using an artificial intelligence (AI) algorithm when the photovoltaic module and string are determined to have a fault according to a determination result from the fault determining unit 300.

The fault classifying unit 400 may include: a learning data collecting unit 410 collecting current-voltage characteristic curves of the photovoltaic module and string in which a fault factor is previously classified, from the outside and generating the collected current-voltage characteristic curves as learning data for AI training; a learning processing unit 420 performing learning on the learning data generated by the learning data collecting unit 410 using a previously stored AI algorithm to generate a learning result model; and a fault analysis unit 430 receiving, when the photovoltaic module and string are determined to have a fault according to a determination result of the fault determining unit 300, the power generation performance measurement value and a voltage-current characteristic curve of a corresponding photovoltaic module and string and applying the received power generation performance measurement value and the voltage-current characteristic curve to the learning result model to classify and analyze a fault factor of the corresponding photovoltaic module and string.

In another general aspect, a fault detection method of a photovoltaic module and string includes: a performance measurement operation (S100) in which a measurement input unit receives a current power generation performance measurement value of a photovoltaic module and string from the outside; an environment measurement operation (S200) in which an estimation calculating unit receives environmental condition values for a current location in which the photovoltaic module is installed; a specification input operation (S300) in which the estimation calculating unit receives preset basic specification values of the photovoltaic module and string and serial/parallel configuration values of the string; a performance estimation operation (S400) in which an estimation calculating unit calculates a power generation performance estimation value of the photovoltaic module and string based on the environmental condition values received in the environment measurement operation (S200); and a fault determining operation (S500) in which a fault determining unit determines whether the photovoltaic module and string have a fault by comparing and analyzing the power generation performance measurement value received in the performance measurement operation (S100) and the power generation performance estimation value calculated in the performance estimation operation (S400).

Furthermore, in the performance estimation operation (S400), voltage and current values of the photovoltaic module and string may be calculated using a previously stored estimation algorithm, and different estimation algorithms may be used according to a double-sided or single-sided configuration form of the photovoltaic module.

Furthermore, in the fault determining operation (S500), respective current-voltage characteristic curves may be generated as the power generation performance measurement value and the power generation performance estimation value and analyzed to extract preset electrical parameters, and whether the photovoltaic module and string have a fault may be determined by analyzing respective loss amounts of the electrical parameters for the power generation performance measurement value.

Furthermore, in the fault determining operation (S500), the photovoltaic module and string may be determined to be normal when respective analyzed loss amounts satisfy all of reference ranges for preset electrical parameters, and may be determined to have a fault when the respective analyzed loss amounts do not satisfy any one of the reference ranges.

Furthermore, the fault detection method may further include: a fault classifying operation (S600) in which when the photovoltaic module and string are determined to have a fault according to a determination result of the fault determining operation (S500), after the fault determining operation (S500) is performed, a fault factor of the photovoltaic module and string is classified and analyzed using an artificial intelligence (AI) algorithm.

Furthermore, in the fault classifying operation (S600), the fault factor may be classified and analyzed by applying the power generation measurement value of the photovoltaic module and string determined to have a fault to an artificial intelligence (AI) learning result model obtained by learning a previously collected current-voltage characteristic curve of the photovoltaic module and string in which a fault factor is classified.

Advantageous Effects

According to the present invention, the fault detection system and method of a photovoltaic module and string may determine whether a photovoltaic DC array has a fault by performing a quantitative evaluation on a current amount of photovoltaic power generation through estimation of performance of the photovoltaic DC array.

In particular, when the photovoltaic DC array is determined to have a fault, a fault factor is detected by applying an artificial intelligence (AI) algorithm, thereby minimizing time economic and time loss due to the fault and increasing performance stability of a solar power plant.

DESCRIPTION OF DRAWINGS

FIG. 5 is a flowchart illustrating a fault detection method of a photovoltaic module and string according to an exemplary embodiment of the present invention.

BEST MODE

Hereinafter, a fault detection system and method of a photovoltaic module and string according to an exemplary embodiment of the present invention having the configuration as described above will be described in detail with reference to the accompanying drawings. The drawings are provided as examples in order to convey the spirit of the present invention to those skilled in the art. Therefore, the present invention is not limited to the drawings presented hereinafter and may be embodied in other forms. Throughout the specification. the same reference numbers will be used to refer to the same or like components.

If there are no other definitions in technical terms and scientific terms used here, the technical terms and scientific terms have the meanings commonly understood by those skilled in the art to which the present invention pertains, and in the following description and accompanying drawings, descriptions of known functions and components that may unnecessarily obscure the subject matter will be omitted.

In addition, the system refers to a set of components including devices, instruments, and means that are organized and regularly interact to perform necessary functions.

In a fault detection system and method of a photovoltaic module and string according to an exemplary embodiment of the present invention, by utilizing a current-voltage characteristic curve by which a performance state and fault of a photovoltaic module and string may be most accurately determined, a current loss amount of a photovoltaic module and string is preferably evaluated by comparing a difference between a current-voltage characteristic curve measured from the photovoltaic module and string with a current-voltage characteristic curve calculated through a preset estimation algorithm (performance estimation model) and current environment data (insolation, ambient temperature, module surface temperature, etc.). When the evaluated loss amount exceeds a preset range, the photovoltaic module and string may be detected to have a fault, and the detected fault may be preferably classified through an analysis of a pattern of the current-voltage characteristic curve of the photovoltaic module and string detected to have a fault using an artificial intelligence (AI) algorithm.

In addition, in the fault detection system and method of a photovoltaic module and string according to an exemplary embodiment of the present invention, in setting an estimation algorithm to perform a fault detection of a double-sided photovoltaic module and string, as well as performing a general fault detection of a single-sided photovoltaic module and string as described above, the estimation algorithm may be set to be different for each of the single-sided photovoltaic module and the double-sided photovoltaic module.

Figure 1:
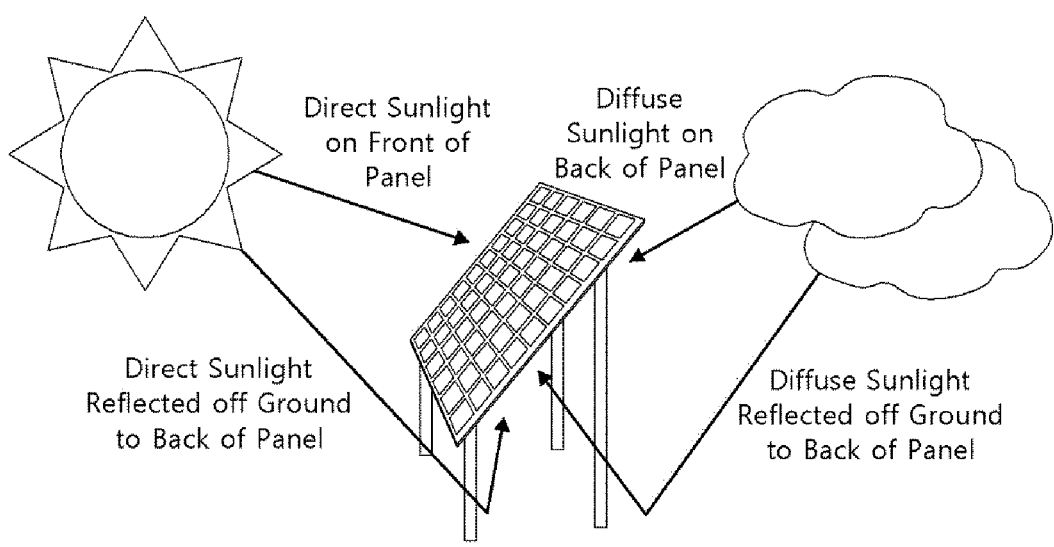
FIG. 1 is a schematic diagram showing a power generation principle of a double-sided photovoltaic module applied to a fault detection system and method of a photovoltaic module and string according to an exemplary embodiment of the present invention.
Figure 2:
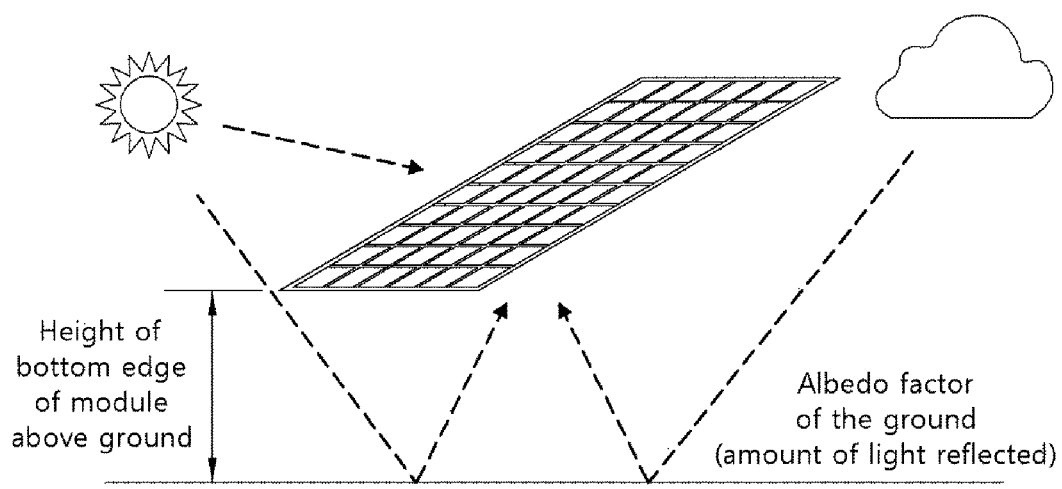
FIG. 2 is a schematic diagram showing a gain factor (Albedo) according to an installation height of a double-sided photovoltaic module applied to a fault detection system and method of a photovoltaic module and string according to an exemplary embodiment of the present invention.
Figure 2:
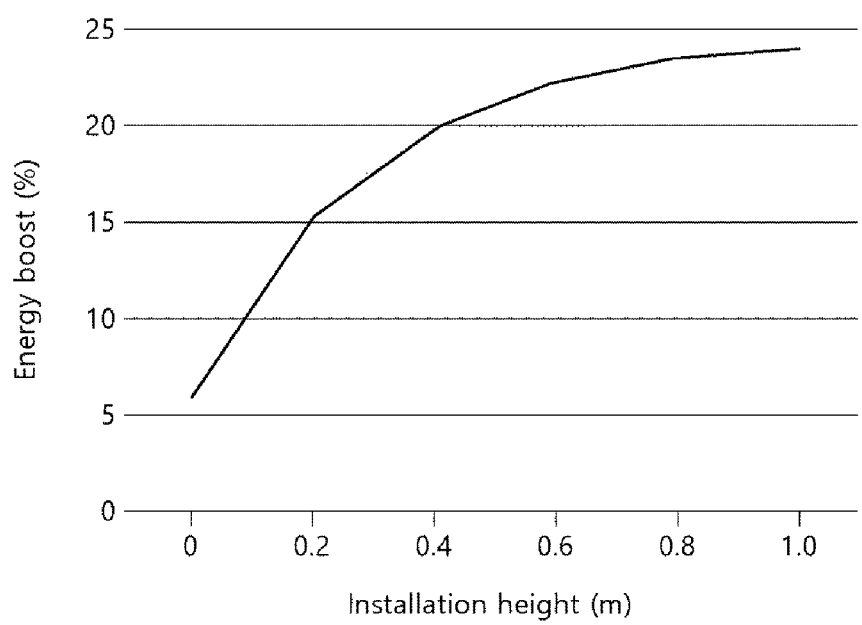

That is, as shown in FIG. 2, it has been reported through various papers that a difference in the amount of power generation occurs depending on an installation height of a photovoltaic module, and thus, in the fault detection system and method of a photovoltaic module and string according to an exemplary embodiment of the present invention, a characteristic equation may be derived in consideration of even an installation height of the double-sided photovoltaic module, as well as an insolation and a temperature, in generating and setting the estimation algorithm for fault detection of the double-sided photovoltaic module.

Figure 3:
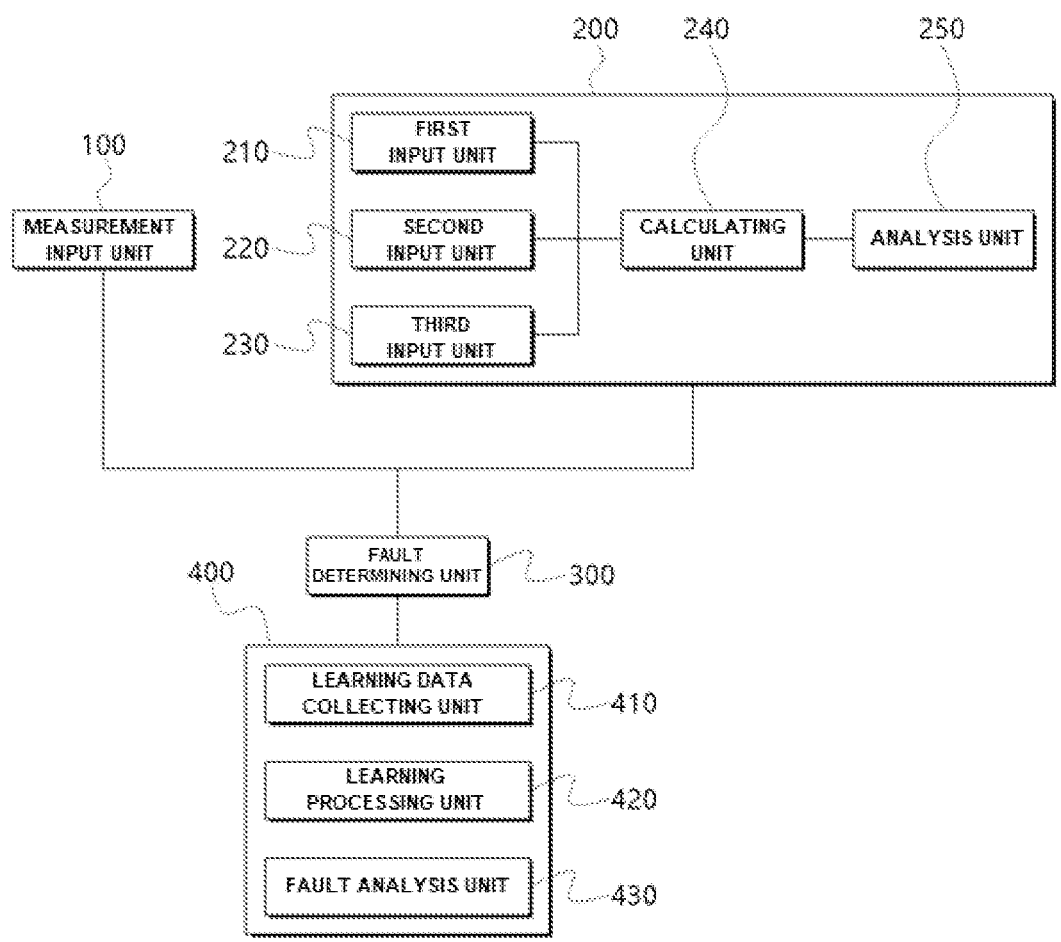
FIG. 3 is a configuration diagram illustrating a fault detection system of a photovoltaic module and string according to an exemplary embodiment of the present invention.

As shown in FIG. 3, the fault detection system of a photovoltaic module and string according to an exemplary embodiment of the present invention may include a measurement input unit 100, an estimation calculating unit 200, and a fault determining unit 300. Here, it is preferable that the above components perform an operation through each arithmetic processing unit including a micro-controller unit (MCU) or a single integrated arithmetic processing unit.

Referring to each component, the measurement input unit 100 may receive a current power generation performance measurement value of the photovoltaic module and string through an externally connected photovoltaic module and string performance measurement device.

As the current power generation performance measurement value of the photovoltaic module and string received through the measurement input unit 100, a current-voltage characteristic curve (I-V curve) may be received and may be generated using a voltage measurement value and a current measurement value of the photovoltaic string.

The measurement input unit 100 may extract preset electrical parameters by analyzing the input current-voltage characteristic curve.

Here, it is preferable to extract a maximum output value $P_{mp}$, a maximum voltage value $V_{mp}$, a maximum current value $I_{mp}$, an open-circuit voltage value $V_{oc}$, and a short-circuit current value $I_{sc}$ as preset electrical parameters, and since extracting electrical parameters by analyzing the received current-voltage characteristic curve corresponds to a known technique, a detailed description thereof will be omitted.

It is preferable that the estimation calculating unit 200 calculates the power generation performance estimation value of the photovoltaic module and string based on the input current environmental conditions.

To this end, the estimation calculating unit 200 may include a first input unit 210, a second input unit 220, a third input unit 230, a calculating unit 240, and an analysis unit 250 as shown in FIG. 3.

The first input unit 210 preferably receives environmental condition values for a current location where the photovoltaic module and string are installed through an externally connected unit, and the environmental condition values may include an insolation, an ambient temperature, a module surface temperature, etc.

The second input unit 220 preferably receives preset basic specification values (electrical specifications, etc.) from an external manager at the time of designing the photovoltaic module, and, for example, is configured to include an open-circuit voltage, a short-circuit current, etc.

The third input unit 230 preferably receives, from the external manager, a preset serial/parallel configuration value at the time of designing the solar string, and for example, is configured to include the number of modules connected in series or parallel.

The calculating unit 240 preferably calculates voltage and current values of the photovoltaic module and string by reflecting the values input through the first input unit 210, the second input unit 220, and the third input unit 230 using a pre-stored estimation algorithm.

Here, in storing the estimation algorithm in advance, the following equations are preferably used, and as described above, in setting the estimation algorithm, it is preferable to set the single-sided photovoltaic module and the double-sided photovoltaic module differently.

In addition, since the single-sided photovoltaic module generates power using sunlight of the front and the double-sided photovoltaic module generates power using sunlight of the front and rear, the single-sided photovoltaic module is preferably interpreted as a front photovoltaic module and the double-sided photovoltaic module is preferably interpreted as a front photovoltaic module+a rear photovoltaic module.

First, the calculating unit 240 preferably calculates a front short-circuit current $I_{sc}$-front and a rear short-circuit current $I_{sc}$-rear separately as current values.

Here, it is preferable to calculate the front short-circuit current $I_{sc}$-front based on Equation 1 below, and it is calculated by reflecting a measurement module temperature, a current aging coefficient, the number of years of installation, and a pollution rate.

$$I_{sc-1} = I_{sc-rated} + \alpha_{isc} \cdot (T_{measure} - 25) \cdot PV_{pv}$$

$$I_{sc-2} = I_{sc-1} \cdot (1 - (\beta_{isc} * O_{year}/100))$$

$$I_{sc-front} = I_{sc-2} \cdot (1 - (\beta_{isc}/100))  \quad \text{[Equation 1]}$$

(Here, $\alpha_{isc}$ is a current temperature coefficient,
$PV_{pv}$ is a number of parallel modules,
$\beta_{isc}$ is a voltage aging coefficient,
$O_{year}$ is the number of years of installation, and
$\gamma_{isc}$ a current pollution factor.)

The rear short-circuit current $I_{sc}$-rear is determined by a backside gain (BG), and the BG is expressed as a ratio according to an albedo value of the rear and an installation height of the module as shown in Equation 2 below.

$$BG = Albeo \cdot Height\_ratio \quad \text{[Equation 2]}$$

(Here, Height_ratio is a rear gain ratio according to the installation height of the module.)

Through this, it is preferable to calculate the rear short-circuit current $I_{sc}$-rear by multiplying the calculated backside gain BG by $I_{sc-2}$ as shown in Equation 3 below.

$$I_{sc-rear} = I_{sc-2} \cdot BG \quad \text{[Equation 3]}$$

Thereafter, as described above, in the case of single-sided photovoltaic module, a short-circuit current is calculated as the front short-circuit current $I_{sc}$-front itself, and in the case of double-sided photovoltaic module, a short-circuit current is calculated as the sum of the front short-circuit current $I_{sc}$-front and the rear short-circuit current $I_{sc}$-rear.

In addition, it is preferable that the calculating unit 240 calculates an open-circuit voltage as a voltage value, and since the open-circuit voltages of the single-sided photovoltaic module and the double-sided photovoltaic module are the same, it is preferable to calculate the open-circuit voltages by reflecting the measurement module temperature, the current aging factor, the number of years of installation, and the pollution rate in a rated open-circuit voltage of the photovoltaic module as shown in Equation 4 below.

$$V_{oc-1} = V_{oc-rated} + \alpha_{voc} \cdot (T_{measure} - 25) \cdot PV_{sv}$$

$$V_{oc-2} = V_{oc-1} \cdot (1 - (\beta_{voc} * O_{year}/100))$$

$$V_{oc-double-sided}^{single} = V_{oc-2} \cdot (1 - (\beta_{voc}/100)) \quad \text{[Equation 4]}$$

(Here, $\alpha_{voc}$ is a voltage temperature coefficient,
$PV_{sr}$ is the number of serial modules,
$\beta_{voc}$ is a voltage aging coefficient,
$O_{year}$ the number of years of installation, and
$\beta_{voc}$ is a voltage pollution factor.)

The calculating unit 240 preferably performs voltage-current calculation through the short-circuit current and the open-circuit voltage as described above, and preferably, the single-sided photovoltaic module is calculated as shown in Equation 5 below, and the double-sided photovoltaic module is calculated as shown in Equation 6 below.

$$I_{ph} = I_{sc-front} \cdot I_{r-measure}/1000 \quad \text{[Equation 5]}$$

$$A = \exp^{(q \cdot K/k \cdot (T_{measure}+273))} - 1$$

$$I_0 = \left(I_{sc-double-sided} - V_{oc\_double-sided}^{single,}/R_{sh}\right)/A$$

$$B = \exp^{\left(q \cdot K/k \cdot (T_{measure}+273) \cdot V_{oc\_double-sided}^{single,}\right)} - 1$$

$$I_{single-sided} = I_{ph} - I_0 \cdot B - \frac{V}{Rsh}$$

(Here, $I_{r-measure}$ is a measured insolation, $q$ is the amount of charge, $k$ is the Boltzmann constant, $K$ is a fill factor coefficient, and $R_{sh}$ is a photovoltaic string parallel resistance.)

$$I_{ph} = I_{sc-double-sided} \cdot I_{r-measure}/1000 \quad \text{[Equation 6]}$$

$$A = \exp^{(q \cdot K/k \cdot (T_{measure}+273))} - 1$$

$$I_0 = \left(I_{sc-double-sided} - V_{oc\_double-sided}^{single,}/R_{sh}\right)/A$$

$$B = \exp^{\left(q \cdot K/k \cdot (T_{measure}+273) \cdot V_{oc\_double-sided}^{single,}\right)} - 1$$

$$I_{double-sided} = I_{ph} - I_0 \cdot B - \frac{V}{Rsh}$$

(Here, $I_{r-measure}$ is a measured insolation, $q$ is the amount of charge, $k$ is the Boltzmann constant, $K$ is a fill factor coefficient, and $R_{sh}$ is a photovoltaic string parallel resistance.)

It is preferable that the analysis unit 250 generates a current-voltage characteristic curve as a power generation performance estimation value using the voltage and current values from the calculating unit 240, and analyzes them to extract preset electrical parameters.

Here, the process of generating a characteristic curve using the voltage-current value or extracting the maximum output value $P_{mp}$, the maximum voltage value $V_{mp}$, the maximum current value $I_{mp}$, the open-circuit voltage value $V_{oc}$, and the short-circuit current value $I_{sc}$, which are preset electrical parameters, by analyzing the current-voltage characteristic curve correspond to known techniques, and thus a detailed description thereof will be omitted.

It is preferable that the fault determining unit 300 compares and analyzes the power generation performance measurement value from the measurement input unit 100 and the power generation performance estimation value from the estimation calculating unit 200 to determine whether the photovoltaic module and string have a fault.

In detail, the fault determining unit 300 preferably compares the power generation performance measurement value from the measurement input unit 100 and the power generation performance estimation value from the estimation calculating unit 200 and analyzes respective loss amounts of the preset electrical parameters over the power generation performance measurement value.

That is, as shown in Equation 7 below, the loss amounts are calculated by comparing the power generation performance measurement value with the power generation performance estimation value based on the preset electrical parameters.

$$P_{mp-ratio} = \frac{P_{mp-measure} - P_{mp-estimation}}{P_{mp-estimation}}$$ [Equation 7]

$$V_{mp-ratio} = \frac{V_{mp-measure} - V_{mp-estimation}}{V_{mp-estimation}}$$

$$I_{mp-ratio} = \frac{I_{mp-measure} - I_{mp-estimation}}{I_{mp-estimation}}$$

$$V_{oc-ratio} = \frac{V_{oc-measure} - V_{oc-measure-average}}{V_{oc-measure-average}}$$

$$I_{sc-ratio} = \frac{I_{sc-measure} - I_{sc-measure-average}}{I_{sc-measure-average}}$$

In addition, it is preferable that the fault determining unit 300 determines whether the photovoltaic module and string have a fault by analyzing the respective loss amounts of the power generation performance measurement value for the calculated electrical parameters based on Table 1 below.

TABLE 1

|  | Normal | Faulty |
|---|---|---|
| $P_{mp-ratio}$ | −0.05< | −0.05> |
| $V_{mp-ratio}$ | −0.05< | −0.05> |
| $I_{mp-ratio}$ | −0.05< | −0.05> |
| $V_{oc-ratio}$ | −0.005< | −0.005> |
| $I_{sc-ratio}$ | −0.02< | −0.02> |

Here, as for normalcy determination, preferably, when the respective loss amounts satisfy all the reference ranges for the preset electrical parameters based on AND condition, the corresponding photovoltaic module and string may be determined to be normal, and as for fault determination, when the respective loss amounts do not satisfy any one of the respective reference ranges for the preset electrical parameters based on an OR condition, the corresponding photovoltaic module and string may be determined to have a fault.

In addition, in the fault detection system of a photovoltaic module and string according to an exemplary embodiment of the present invention, preferably, fault classification is performed through pattern analysis through an AI algorithm of a current-voltage characteristic curve of the photovoltaic module and string determined to have a fault according to a determination result of the fault determining unit 300.

To this end, the fault detection system of a photovoltaic module and string according to an exemplary embodiment of the present invention is preferably configured to further include a fault classifying unit 400 as shown in FIG. 3.

When it is determined that the photovoltaic module and string are determined to have a fault according to the determination result of the fault determining unit 300, the fault classifying unit 400 preferably classifies and analyzes fault factors of the photovoltaic module and string using an AI algorithm.

Specifically, as shown in FIG. 3, the fault classifying unit 400 is preferably configured to include a learning data collecting unit 410, a learning processing unit 420, and a fault analysis unit 430.

Figure 4:
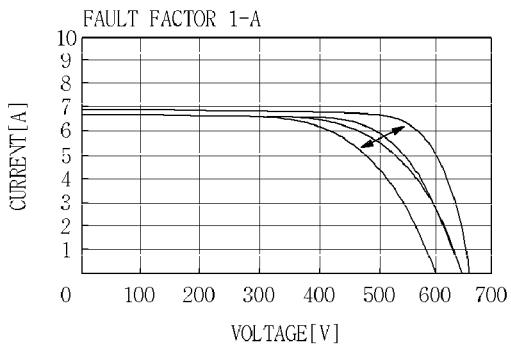
FIG. 4 is a graph of learning data by a fault classifying unit 400 of a fault detection system of a photovoltaic module and string according to an exemplary embodiment of the present invention.
Figure 4:
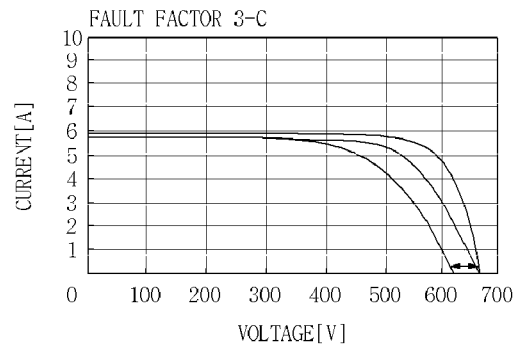
Figure 4:
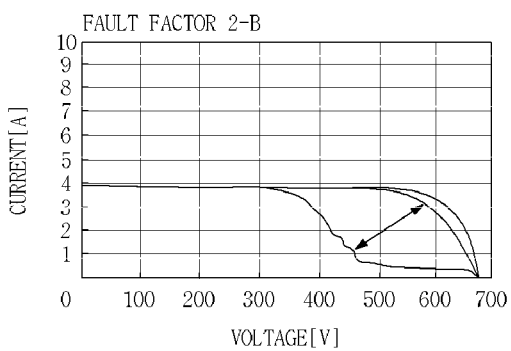
Figure 4:
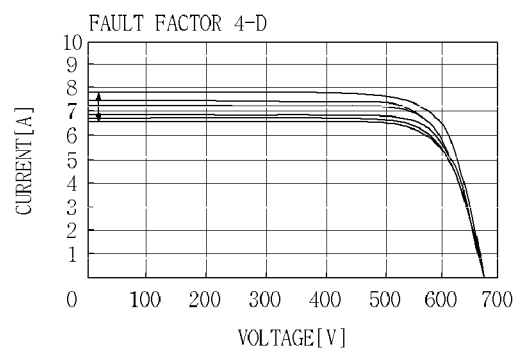
Figure 4:
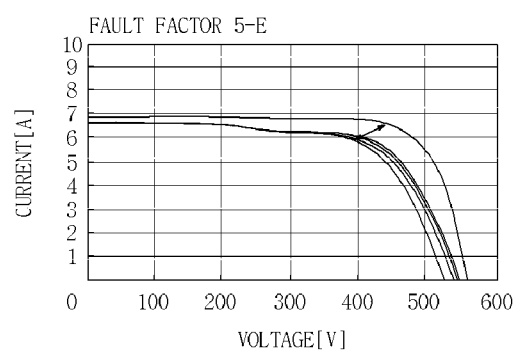

As shown in FIG. 4, the learning data collecting unit 410 preferably collects various current-voltage characteristic curves of each photovoltaic module and string in which various fault factors are pre-classified from the outside, and generates learning data for AI learning.

In general, the current-voltage characteristic curve representing electrical performance of the photovoltaic module shows different patterns according to fault factors. Using the different patterns of the current-voltage characteristic curve according to these fault factors, various current-voltage characteristic curves generated according to various fault factors (PID phenomenon, contamination at a bottom of the module, bypass diode fault, installation angle difference between modules, partial shading or shading, etc.) may be collected and generated as learning data for AI learning.

Here, for the single-sided photovoltaic module and string, the current-voltage characteristic curves reflecting various fault factors, and for the double-sided photovoltaic module and string, the current-voltage characteristic curves reflecting various fault factors may be collected differently and generated as learning data.

It is preferable that the learning processing unit 420 performs learning on the learning data generated by the learning data collecting unit 410 using a pre-stored AI algorithm and generates a corresponding learning result model.

Here, since the learning data of the single-sided photovoltaic module and string and the learning data of the double-sided photovoltaic module and string are generated, separately, the learning process is also performed, separately, to generate the learning result model for each of the single-sided photovoltaic module and string and the double-sided photovoltaic module and string.

In addition, when the photovoltaic module and string are determined to have a fault according to the determination result of the fault determining unit 300, the fault analysis unit 430 preferably classifies and analyzes a corresponding fault factor by applying the current-voltage characteristic curve included in the power generation performance measurement value received through the measurement input unit 100 for the corresponding photovoltaic module and string, in other words, the photovoltaic module and string determined to have a fault to the generated learning result model.

In detail, preferably, when the photovoltaic module and string determined to have a fault are a single-sided photovoltaic module, the corresponding fault factor is classified and analyzed by applying the current-voltage characteristic curve included in the power generation measurement value received through the measurement input unit 100 to a model according to a learning result for the single-sided photovoltaic module and string, among the generated learning result models, and when the photovoltaic module and string determined to have a fault are a double-sided photovoltaic module, the corresponding fault factor is classified and analyzed by applying the current-voltage characteristic curve to a model according to a learning result for the double-sided photovoltaic module.

In addition, as shown in FIG. 5, preferably, the fault detection method of a photovoltaic module and string according to an exemplary embodiment of the present invention includes a performance measurement operation (S100), an environment measurement operation (S200), a specification input operation (S300), a performance estimation operation (S400), and a fault determining operation (S500).

Referring to each operation, in the performance measurement operation (S100), it is preferable to receive a current power generation performance measurement value of the photovoltaic module and string from the measurement input unit 100 through an externally connected performance measurement device of the photovoltaic module and string.

In the performance measurement operation (S100), a current-voltage characteristic curve (I-V curve) is preferably received as the current power generation performance measurement value of the photovoltaic module and string, and is generated using a voltage measurement value and a current measurement value of the photovoltaic module and string.

In addition, in the performance measurement operation (S100), it is preferable to extract preset electrical parameters by analyzing the received current-voltage characteristic curve.

Here, it is preferable to extract a maximum output value $P_{mp}$, a maximum voltage value $V_{mp}$, a maximum current value $I_{mp}$, an open-circuit voltage value $V_{oc}$, and a short-circuit current value $I_{sc}$ as preset electrical parameters, and since extracting electrical parameters by analyzing the received current-voltage characteristic curve corresponds to a known technique, a detailed description thereof will be omitted.

In the environment measurement operation (S200), it is preferable for the estimation calculating unit 200 to receive the environmental condition values for the current location where the photovoltaic module and string are installed through the externally connected unit, and the environmental condition values include an insolation, an ambient temperature, a module surface temperature, etc.

In the specification input operation (S300), preferably, the estimation calculating unit 200 receives preset basic specification values (electrical specifications, etc.) at the time of designing the photovoltaic module from the external manager and preset serial/parallel configuration values at the time of designing the photovoltaic string.

The basic specification value may include, for example, an open-circuit voltage, a short-circuit current, etc., and the series/parallel configuration value may include, for example, the number of modules connected in series or parallel, etc.

In the performance estimation operation (S400), it is preferable that the estimation calculating unit 200 calculates a power generation performance estimation value of the photovoltaic module and string based on the environmental condition values input by the environment measurement operation (S200).

In detail, in the performance estimation operation (S400), the voltage and current values of the photovoltaic module and string may be calculated by reflecting the values input through the environment measurement operation (S200) and the specification input operation (S300) using a pre-stored estimation algorithm.

Here, in pre-storing the estimation algorithm, the above equations are preferably used, and as described above, in setting the estimation algorithm, it is preferable to set the single-sided photovoltaic module and the double-sided photovoltaic module differently.

In addition, since a single-sided photovoltaic module generates power using sunlight of the front and the double-sided photovoltaic module generates power using sunlight of the front and rear, the single-sided photovoltaic module is preferably interpreted as a front photovoltaic module and the double-sided photovoltaic module is preferably interpreted as a front photovoltaic module+a rear photovoltaic module.

In the performance estimation operation (S400), first, it is preferable to calculate a front short-circuit current $I_{sc}$-front and a rear short-circuit current $I_{sc}$-rear separately as current values.

Here, it is preferable to calculate the front short-circuit current $I_{sc}$-front based on Equation 1 above, and it is calculated by reflecting a measurement module temperature, a current aging coefficient, the number of years of installation, and a pollution rate.

The rear short-circuit current $I_{sc}$-rear is determined by a backside gain (BG), and the BG is expressed as a ratio according to an albedo value of the rear and an installation height of the module as shown in Equation 2 above.

Through this, it is preferable to calculate the rear short-circuit current $I_{sc}$-rear by multiplying the calculated backside gain BG by $I_{sc-2}$ as shown in Equation 3 above.

Thereafter, as described above, in the case of single-sided photovoltaic module, a short-circuit current is calculated as the front short-circuit current $I_{sc}$-front itself, and in the case of double-sided photovoltaic module, a short-circuit current is calculated as the sum of the front short-circuit current $I_{sc}$-front and the rear short-circuit current $I_{sc}$-rear.

In addition, it is preferable to calculate an open-circuit voltage as a voltage value, and since the open-circuit voltages of the single-sided photovoltaic module and the double-sided photovoltaic module are the same, it is preferable to calculate the open-circuit voltages by reflecting the measurement module temperature, the current aging factor, the number of years of installation, and the pollution rate in a rated open-circuit voltage of the photovoltaic module as shown in Equation 4 below.

It is preferable to perform voltage-current calculation through the short-circuit current and the open-circuit voltage as described above, and preferably, the single-sided photovoltaic module is calculated as shown in Equation 5 above, and the double-sided photovoltaic module is calculated as shown in Equation 6 above.

In the fault determining operation (S500), the fault determining unit 300 compares and analyzes the power generation performance measurement value input by the performance measurement operation (S100) and the generation performance estimation value calculated by the performance estimation operation (S400), it is desirable to determine whether the module and string are faulty.

In detail, in the fault determining operation (S500), it is preferable to analyze respective loss amounts of the preset electrical parameters with respect to the power generation performance measurement value by comparing the power generation performance measurement value with the power generation performance estimation value.

That is, as shown in Equation 7 above, the loss amounts are calculated by comparing the power generation performance measurement value with the power generation performance estimation value based on the preset electrical parameters.

Here, in the fault determining operation (S500), it is preferable to determine whether the photovoltaic module and string have a fault by analyzing the calculated loss amounts of the power generation performance measurement value for the respective electrical parameters based on Table 1 above, and, as for normalcy determination, preferably, when the respective loss amounts satisfy all the reference ranges for the preset electrical parameters based on AND condition, the corresponding photovoltaic module and string may be determined to be normal, and as for fault determination, when the respective loss amounts do not satisfy any one of the respective reference ranges for the preset electrical parameters based on an OR condition, the corresponding photovoltaic module and string may be determined to have a fault.

In addition, the fault detection method of a photovoltaic module and string according to an exemplary embodiment of the present invention preferably further includes a fault classifying operation (S600) after performing the fault determining operation (S500) as shown in FIG. 5.

In the fault classifying operation (S600), preferably, the fault classifying unit 400 performs fault classification through pattern analysis through an AI algorithm of the current-voltage characteristic curve of the photovoltaic module and string determined to have a fault.

That is, in the fault classifying operation (S600), when it is determined that the photovoltaic module and string are determined to have a fault according to the determination result of the fault determining operation (S500), fault factors of the photovoltaic module and string may be classified and analyzed using an AI algorithm.

Here, in the fault classifying operation (S600), preferably, various current-voltage characteristic curves of each photovoltaic module and string in which various fault factors are pre-classified may be collected from the outside in advance, and generated as learning data for AI learning.

In general, the current-voltage characteristic curve representing electrical performance of the photovoltaic module shows different patterns according to fault factors. Using the different patterns of the current-voltage characteristic curve according to these fault factors, various current-voltage characteristic curves generated according to various fault factors (PID phenomenon, contamination at a bottom of the module, bypass diode fault, installation angle difference between modules, partial shading or shading, etc.) may be collected and generated as learning data for AI learning.

Here, for the single-sided photovoltaic module and string, the current-voltage characteristic curves reflecting various fault factors, and for the double-sided photovoltaic module and string, the current-voltage characteristic curves reflecting various fault factors may be collected differently and generated as learning data.

In addition, in the fault classifying operation (S600), it is preferable to perform learning on the generated learning data generated using a pre-stored AI algorithm and generate a corresponding learning result model.

Here, since the learning data of the single-sided photovoltaic module and string and the learning data of the double-sided photovoltaic module and string are generated, separately, the learning process is also performed, separately, to generate the learning result model for each of the single-sided photovoltaic module and string and the double-sided photovoltaic module and string.

Through this, it is preferable to classify and analyze a corresponding fault factor by applying the current-voltage characteristic curve included in the power generation performance measurement value received through the performance measurement operation (S100) for the photovoltaic module and string determined to have a fault to the generated learning result model.

In detail, preferably, when the photovoltaic module and string determined to have a fault are a single-sided photovoltaic module, the corresponding fault factor is classified and analyzed by applying the current-voltage characteristic curve included in the received power generation measurement value to a model according to a learning result for the single-sided photovoltaic module and string, among the generated learning result models, and when the photovoltaic module and string determined to have a fault are a double-sided photovoltaic module, the corresponding fault factor is classified and analyzed by applying the current-voltage characteristic curve to a model according to a learning result for the double-sided photovoltaic module.

Through this, the fault detection system of a photovoltaic module and string according to an exemplary embodiment of the present invention may not only determine whether the single/double-sided photovoltaic module and string have a fault, but also infer/detect a cause of the fault, that is, a fault factor, of the photovoltaic module and string determined to have a fault with very high accuracy, using an AI algorithm.

Meanwhile, the fault detection method of a photovoltaic module and string according to an exemplary embodiment of the present invention may be implemented in the form of a program command that may be executed through a unit of processing various information electronically and recorded in a storage medium. The storage medium may include program instructions, data files, data structures, etc. alone or in combination.

Program instructions recorded in a storage medium may be particularly designed and structured for the present invention or available to those skilled in computer software. Examples of the computer-readable recording medium include hardware devices particularly configured to store and perform program instructions, such as magnetic mediums, such as a hard disk, a floppy disk, and a magnetic tape; optical mediums, such as a compact disk-read only memory (CD-ROM) and a digital versatile disc (DVD); magneto-optical mediums, such as floptical disks; a read-only memory (ROM); a random access memory (RAM); and a flash memory. The program instructions may include, for example, a high-level language code that can be executed by a computer using an interpreter, as well as a machine language code made by a compiler.

Although the present invention has been described in terms of specific items such as detailed elements as well as the limited embodiments and the drawings, they are only provided to help more general understanding of the invention, and the present invention is not limited to the above embodiments. It will be appreciated by those skilled in the art to which the present invention pertains that various modifications and changes may be made from the above description.

Therefore, the spirit of the present invention shall not be limited to the above-described embodiments, and the entire scope of the appended claims and their equivalents will fall within the scope and spirit of the invention.

DESCRIPTION OF REFERENCE NUMERALS

100: measurement input unit
200: estimation calculating unit
210: first input unit
220: second input unit
230: third input unit 240: calculating unit
250: analysis unit
300: fault determining unit
400: fault classifying unit
410: learning data collecting unit
420: learning processing unit
430: fault analysis unit

The invention claimed is:

1. A fault detection system of a photovoltaic module and string, the fault detection system comprising:
   a measurement input unit receiving a current power generation performance measurement value of the photovoltaic module and string from the outside;
   an estimation calculating unit calculating a power generation performance estimation value of the photovoltaic module and string based on input current environmental conditions; and
   a fault determining unit determining whether the photovoltaic module and string have a fault by comparing and analyzing the power generation performance measurement value from the measurement input unit and the power generation performance estimation value from the estimation calculating unit,
   wherein
   the photovoltaic module is configured as a double-sided or single-sided photovoltaic module; and
   wherein the estimation calculating unit includes:
   a first input unit receiving environmental condition values for a current position in which the photovoltaic module and string are installed;
   a second input unit receiving preset basic specification values of the photovoltaic module;
   a third input unit receiving serial/parallel configuration value of the photovoltaic string;
   a calculating unit calculating voltage and current values of the photovoltaic module by reflecting values received by the first input unit, the second input unit, and the third input unit using a previously stored estimation algorithm; and
   an analysis unit generating a current-voltage characteristic curve with the power generation performance estimation value using the voltage and current values calculated by the calculating unit and analyzing the generated current-voltage characteristic curve to extract preset electrical parameters; and
   wherein the calculating unit uses different estimation algorithms according to whether the photovoltaic module is configured as a double-sided photovoltaic module or a single-sided photovoltaic.

2. The fault detection system of claim 1, wherein the measurement input unit
   receives current-voltage characteristic curves as the power generation performance measurement values and analyzes the received current-voltage characteristic curves to extract preset electrical parameters.

3. The fault detection system of claim 1, wherein, the fault determining unit
   determines whether the photovoltaic module and string have a fault by evaluating loss amounts by comparing an electrical parameter of the power generation performance measurement value from the measurement input unit and an electrical parameter of the power generation performance estimation value from the estimation calculating unit.

4. The fault detection system of claim 3, wherein,
   the fault determining unit
   determines that the photovoltaic module and string are normal when respective analyzed loss amounts satisfy all of reference ranges for preset electrical parameters, and
   determines that the photovoltaic module and string have a fault when the respective analyzed loss amounts do not satisfy any one of the reference ranges.

5. The fault detection system of claim 1, further comprising:
   a fault classifying unit classifying and analyzing a fault factor of the photovoltaic module and string using an artificial intelligence (AI) algorithm when the photovoltaic module and string are determined to have a fault according to a determination result from the fault determining unit.

6. The fault detection system of claim 5, wherein,
   the fault classifying unit includes:
   a learning data collecting unit collecting current-voltage characteristic curves of the photovoltaic module and string in which a fault factor is previously classified from the outside,
   and generating the collected current-voltage characteristic curves as learning data for AI training;
   a learning processing unit performing learning on the learning data generated by the learning data collecting unit using a previously stored AI algorithm to generate a learning result model; and
   a fault analysis unit receiving, when the photovoltaic module and string are determined to have a fault according to a determination result of the fault determining unit, the power generation performance measurement value and a voltage-current characteristic curve of a corresponding photovoltaic module and string, and applying the received power generation performance measurement value and the voltage-current characteristic curve to the learning result model to classify and analyze a fault factor of the corresponding photovoltaic module and string.

7. A fault detection method of a photovoltaic module and string,
   the fault detection method comprising:
   a performance measurement operation in which a measurement input unit receives a current power generation performance measurement value of a photovoltaic module and string from the outside;
   an environment measurement operation in which an estimation calculating unit receives environmental condition values for a current location in which the photovoltaic module is installed;
   a specification input operation in which the estimation calculating unit receives preset basic specification values of the photovoltaic module and string and serial/parallel configuration values of the string;
   a performance estimation operation in which an estimation calculating unit calculates a power generation performance estimation value of the photovoltaic module and string based on the environmental condition values received in the environment measurement operation; and
   a fault determining operation in which a fault determining unit determines whether the photovoltaic module and string have a fault by comparing and analyzing the power generation performance measurement value received in the performance measurement operation and the power generation performance estimation value calculated in the performance estimation operation; and wherein, in the performance estimation operation, voltage and current values of the photovoltaic module and string are calculated using a previously stored estimation algorithm, and different estimation algorithms are used according to a double-sided or single-sided configuration form of the photovoltaic module.

8. The fault detection method of claim 7, wherein, in the fault determining operation, respective current-voltage characteristic curves are generated as the power generation performance measurement value and the power generation performance estimation value and analyzed to extract preset electrical parameters, and whether the photovoltaic module and string have a fault is determined by analyzing respective loss amounts of the electrical parameters for the power generation performance measurement value.

9. The fault detection method of claim 8, wherein, in the fault determining operation, the photovoltaic module and string are determined to be normal when respective analyzed loss amounts satisfy all of reference ranges for preset electrical parameters, and are determined to have a fault when the respective analyzed loss amounts do not satisfy any one of the reference ranges.

10. The fault detection method of claim 7, further comprising:

a fault classifying operation in which when the photovoltaic module and string are determined to have a fault according to a determination result of the fault determining operation, after the fault determining operation is performed, a fault factor of the photovoltaic module and string is classified and analyzed using an artificial intelligence (AI) algorithm.

11. The fault detection method of claim 10, wherein, in the fault classifying operation, the fault factor is classified and analyzed by applying the power generation measurement value of the photovoltaic module and string determined to have a fault to an artificial intelligence (AI) learning result model obtained by learning a previously collected current-voltage characteristic curve of the photovoltaic module and string in which a fault factor is classified.

* * * * *